(12) United States Patent
Ye (10) Patent No.: US 11,532,678 B2
(45) Date of Patent: Dec. 20, 2022

(54) TOUCH DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 50 days.

(21) Appl. No.: 17/047,407

(22) PCT Filed: Aug. 7, 2020

(86) PCT No.: PCT/CN2020/107859
§ 371 (c)(1),
(2) Date: Oct. 14, 2020

(87) PCT Pub. No.: WO2022/000706
PCT Pub. Date: Jan. 6, 2022

(65) Prior Publication Data
US 2022/0199696 A1     Jun. 23, 2022

(30) Foreign Application Priority Data
Jun. 30, 2020   (CN) .......................... 202010621953.5

(51) Int. Cl.
*H01L 27/32*     (2006.01)
*G06F 3/044*     (2006.01)
(Continued)

(52) U.S. Cl.
CPC .......... *H01L 27/323* (2013.01); *G06F 3/0412* (2013.01); *G06F 3/0446* (2019.05);
(Continued)

(58) Field of Classification Search
CPC ............... H01L 27/323; H01L 21/3246; H01L 51/5237; G06F 3/0446; G06F 3/0412
(Continued)

(56) References Cited

U.S. PATENT DOCUMENTS

2003/0096446 A1* 5/2003 Lim .................... H01L 27/3283
438/82
2003/0170929 A1* 9/2003 Guenther ............ H01L 27/3283
438/82
(Continued)

FOREIGN PATENT DOCUMENTS

CN     107957799 A     4/2018
CN     109300959 A     2/2019
(Continued)

OTHER PUBLICATIONS

Yang Shengji Touch Panel, Manufacturing Method Thereof and Display Device Apr. 4, 2019 BOE Technology Group Co Ltd WO2019062178 (A1) paragraphs 6-70 English.*
(Continued)

*Primary Examiner* — Prabodh M Dharia
(74) *Attorney, Agent, or Firm* — PV IP PC; Wei Te Chung; Ude Lu (57) ABSTRACT

A touch display device is provided, which includes an organic light-emitting diode display panel, the organic light-emitting diode display panel includes support pillars and a cathode, a part of the cathode is formed on the support pillars; a touch layer includes an insulation layer and a first conductive layer, the insulation layer is provided with protrusions, a part of the first conductive layer is positioned on
(Continued)

a side of the protrusions away from the cathode, and orthographic projections of the protrusions on the touch display device at least partially coincide with orthographic projections of the support pillars on the touch display device.

14 Claims, 5 Drawing Sheets

(51) Int. Cl.
  *G06F 3/041* (2006.01)
  *H01L 51/52* (2006.01)
(52) U.S. Cl.
  CPC ...... *H01L 27/3246* (2013.01); *H01L 51/5237* (2013.01); *G06F 2203/04111* (2013.01); *H01L 2251/5338* (2013.01)
(58) Field of Classification Search
  USPC .......................................................... 345/173
  See application file for complete search history.

(56) References Cited

U.S. PATENT DOCUMENTS

| | | | |
|---|---|---|---|
| 2019/0319076 A1 | 10/2019 | Lee et al. | |
| 2020/0035756 A1* | 1/2020 | Yang | H01L 51/5221 |
| 2020/0052050 A1* | 2/2020 | Jiang | H01L 51/5212 |

FOREIGN PATENT DOCUMENTS

| | | |
|---|---|---|
| CN | 109599425 A | 4/2019 |
| CN | 110379830 A | 10/2019 |

OTHER PUBLICATIONS

Yang Shengji Touch Panel, Manufacturing Method Thereof and Display Device Apr. 4, 2019 BOE Technology Group Co Ltd WO2019062178 (A1) paragraphs 6-70 Chinese.*
Yang Shengji Touch Panel, Manufacturing Method Thereof and Display Device Apr. 4, 2019 BOE Technology Group Co Ltd WO2019062178 (A1) paragraphs 6-70 Drawings.*

* cited by examiner

Prior Art

TOUCH DISPLAY DEVICE

FIELD OF INVENTION

The present application relates to the field of touch display technologies, and in particular to a touch display device.

BACKGROUND OF INVENTION

Flexible organic light-emitting diode (OLED) displays have advantages of active light-emitting, wide viewing angles, wide color gamut, high brightness, fast response times, low power consumption, and structural flexibility. Flexible organic light-emitting diode displays becoming more and more popular in the market, and gradually replacing liquid crystal displays as a mainstream of display technology.

Figure 1:
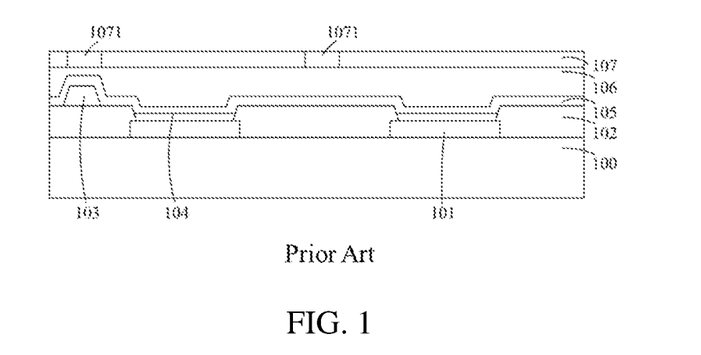
FIG. 1 is a schematic diagram of a conventional flexible organic light-emitting diode display.

Flexible organic light-emitting diode displays are classified into top-emission type and bottom-emission type according to their light-emitting positions. Currently, top-emission organic light-emitting diode displays are a mainstream of mass production technology for the organic light-emitting diode displays. As shown in FIG. 1, it is a schematic diagram of a conventional flexible organic light-emitting diode display. The conventional flexible organic light-emitting diode display includes a thin film transistor array (TFT Array) substrate 100, an anode layer 101, a pixel definition layer (PDL) 102, support pillars (photo spacer, PS) 103, an organic light-emitting layer (luminescence layer, EL) 104, a cathode layer 105, an thin film encapsulation (TFE) layer 106, and a touch electrode layer 107 positioned above the thin film encapsulation layer 106. The touch electrode layer includes a metal grid, the metal grid is composed of metal wires 1071. Wherein, the support pillars 103 are dispersedly arranged above the pixel definition layer 102 according to a certain rule to form a plurality of protrusions, and the support pillars 103 are positioned on the pixel definition layer at a position of a gap between openings of the pixel definition layer of adjacent light-emitting sub-pixels. The support pillars 103 are mainly used for a vapor deposition process of the organic light-emitting layer, where when a substrate on which the support pillars 103 are formed is in contact with a fine metal mask (FMM), the support pillars 103 are in contact with the fine metal mask, thereby effectively preventing metal lines and like from being scratched by the fine metal mask. In addition, since the cathode 105 is vapor-deposited on an entire surface, a gap between the cathode 105 on the support pillars 103 and the touch electrode on a surface of the thin film encapsulation layer 106 is less than a gap between the cathode 105 on an upper surface of the pixel definition layer 102 and the touch electrode on the thin film encapsulation layer 106, resulting in a larger parasitic capacitance of the touch electrodes directly positioned above the support pillars 103, thereby affecting a touch sensitivity and other performance of that region.

Therefore, it is necessary to propose a technical solution to solve a problem that a small gap between the cathode on the support pillars and the touch electrode leads to a large parasitic capacitance, which affects performance such as touch sensitivity.

SUMMARY OF INVENTION

Technical Problem

The purpose of the present application is to provide a touch display device to solve a problem that a small gap between the cathode on the support pillars and the touch electrode leads to a large parasitic capacitance, which affects performance such as touch sensitivity.

Technical Solutions

In order to achieve the above objective, the present application provides a touch display device, the touch display device includes:

an organic light-emitting diode display panel including support pillars and a cathode, wherein a part of the cathode is formed on the support pillars;

a touch layer positioned on a side of the organic light-emitting diode display panel, wherein the touch layer includes an insulation layer and a first conductive layer, the insulation layer is provided with protrusions, a part of the first conductive layer is positioned on a side of the protrusions away from the cathode, and orthographic projections of the protrusions on the touch display device at least partially coincide with orthographic projections of the support pillars on the touch display device;

wherein the organic light-emitting diode display panel further includes a pixel definition layer, the support pillars are arranged on the pixel definition layer, another part of the cathode is formed on the pixel definition layer, and another part of the first conductive layer is formed on the insulation layer;

wherein a gap defined between the another part of the cathode formed on the pixel definition layer and a corresponding part of the first conductive layer is equal to a gap defined between the part of the cathode formed on the support pillars and the part of the first conductive layer formed on the side of the protrusions away from the cathode;

wherein the touch layer further includes a second conductive layer, the insulation layer is positioned between the first conductive layer and the second conductive layer, the second conductive layer includes bridge lines, and orthographic projections of the bridge lines on the touch display device are staggered from the orthographic projections of the support pillars on the touch display device.

In the aforementioned touch display device, wherein a height of the protrusions is equal to a height of the support pillars.

In the aforementioned touch display device, wherein the first conductive layer includes first electrodes and second electrodes, the first electrodes are electrically insulated from the second electrodes, adjacent two of the first electrodes are formed continuously, adjacent two of the second electrodes are electrically connected through the bridge lines, and each of the second electrodes is electrically connected to the bridge lines through a first via defined in the insulation layer.

In the aforementioned touch display device, wherein the first conductive layer further includes first leads and second leads, the second conductive layer further includes third leads and fourth leads, the third leads are electrically connected to the first leads in one-to-one correspondence, the third leads are electrically connected to a part of the first electrodes through second vias defined in the insulation layer, the fourth leads are electrically connected to the second leads in one-to-one correspondence, and the fourth leads are electrically connected to a part of the second electrodes through third vias defined in the insulation layer.

In the aforementioned touch display device, wherein the orthographic projections of the support pillars on the touch display device are positioned within the orthographic projections of the protrusions on the touch display device, or, the orthographic projections of the support pillars on the touch display device completely coincide with the orthographic projections of the protrusions on the touch display device.

In the aforementioned touch display device, wherein the insulation layer includes at least one of an inorganic insulation layer or an organic insulation layer.

In the aforementioned touch display device, wherein the organic light-emitting diode display panel includes a plurality of sub-pixels, and each of the support pillars is disposed between two adjacent sub-pixels.

In the aforementioned touch display device, wherein the organic light-emitting diode display panel includes an encapsulation layer, and the encapsulation layer is disposed between the cathode and the touch layer.

A touch display device, wherein the touch display device includes:

an organic light-emitting diode display panel including support pillars and a cathode, wherein a part of the cathode is formed on the support pillars; and a touch layer positioned on a side of the organic light-emitting diode display panel, wherein the touch layer includes an insulation layer and a first conductive layer, the insulation layer is provided with protrusions, a part of the first conductive layer is positioned on a side of the protrusions away from the cathode, and orthographic projections of the protrusions on the touch display device at least partially coincide with orthographic projections of the support pillars on the touch display device.

In the aforementioned touch display device, wherein the organic light-emitting diode display panel further includes a pixel definition layer, the support pillars are arranged on the pixel definition layer, another part of the cathode is formed on the pixel definition layer, and another part of the first conductive layer is formed on the insulation layer; wherein a gap defined between the another part of the cathode formed on the pixel definition layer and a corresponding part of the first conductive layer is equal to a gap defined between the part of the cathode formed on the support pillars and the part of the first conductive layer formed on the side of the protrusions away from the cathode.

In the aforementioned touch display device, wherein a height of the protrusions is equal to a height of the support pillars.

In the aforementioned touch display device, wherein the touch layer further includes a second conductive layer, the insulation layer is positioned between the first conductive layer and the second conductive layer, the second conductive layer includes a bridge lines, and orthographic projections of the bridge lines on the touch display device is staggered from the orthographic projections of the support pillars on the touch display device.

In the aforementioned touch display device, wherein the first conductive layer includes first electrodes and second electrodes, the first electrodes are electrically insulated from the second electrodes, adjacent two of the first electrodes are formed continuously, adjacent two of the second electrodes are electrically connected through the bridge lines, and each of the second electrodes is electrically connected to the bridge lines through a first via defined in the insulation layer.

In the aforementioned touch display device, wherein the first conductive layer further includes first leads and second leads, the second conductive layer further includes third leads and fourth leads, the third leads are electrically connected to the first leads in one-to-one correspondence, the third leads are electrically connected to a part of the first electrodes through second vias defined in the insulation layer, the fourth leads are electrically connected to the second leads in one-to-one correspondence, and the fourth leads are electrically connected to a part of the second electrodes through third vias defined in the insulation layer.

In the aforementioned touch display device, wherein the orthographic projections of the support pillars on the touch display device are positioned within the orthographic projections of the protrusions on the touch display device, or, the orthographic projections of the support pillars on the touch display device completely coincide with the orthographic projections of the protrusions on the touch display device.

In the aforementioned touch display device, wherein the insulation layer includes at least one of an inorganic insulation layer or an organic insulation layer.

In the aforementioned touch display device, wherein the organic light-emitting diode display panel includes a plurality of sub-pixels, and each of the support pillars is disposed between two adjacent sub-pixels.

In the aforementioned touch display device, wherein the organic light-emitting diode display panel includes an encapsulation layer, and the encapsulation layer is disposed between the cathode and the touch layer.

Beneficial Effect

The present application provides a touch display device. The touch display device includes an organic light-emitting diode display panel. The organic light-emitting diode display panel includes support pillars and a cathode, wherein a part of the cathode is formed on the support pillars; and a touch layer positioned on a side of the organic light-emitting diode display panel, wherein the touch layer includes an insulation layer and a first conductive layer, the insulation layer is provided with protrusions, a part of the first conductive layer is positioned on a side of the protrusions away from the cathode, and orthographic projections of the protrusions on the touch display device at least partially coincide with orthographic projections of the support pillars on the touch display device. By providing protrusions on the insulation layer of the touch layer, the gap between the cathode positioned on the support pillars and the first conductive layer on the side of the protrusions positioned on the insulation layer is increased, thereby reducing the parasitic capacitance formed between the first conductive layer arranged on the corresponding support pillars and the cathode positioned on the support pillars, increasing a touch reporting rate of the touch display device.

DETAILED DESCRIPTION OF EMBODIMENTS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

Figure 2:
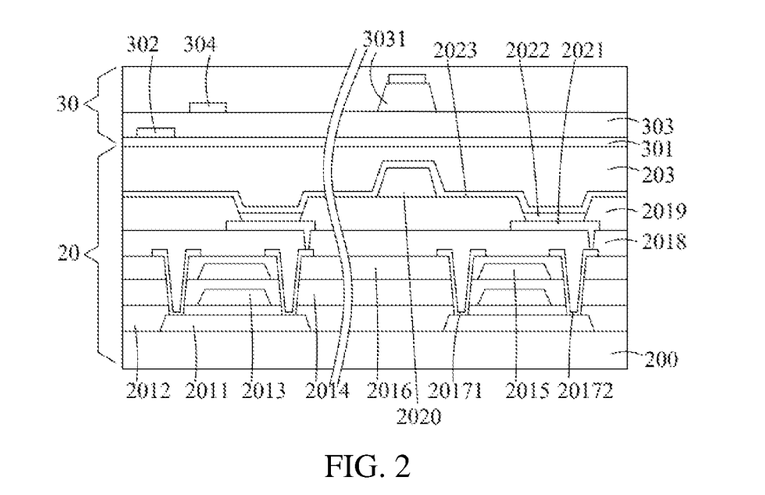
FIG. 2 is a schematic cross-sectional view of a touch display device according to the present application.

Please refer to FIG. 2, which is a schematic cross-sectional view of a touch display device of the present application. The touch display device includes an organic light-emitting diode display panel 20 and a touch layer 30. The organic light-emitting diode display panel 20 can be a flexible organic light-emitting diode display panel or a rigid organic light-emitting diode display panel. The touch layer 30 is positioned on a side of the organic light-emitting diode display panel 20. Specifically, the touch layer 30 is positioned on a light-output side of the organic light-emitting diode display panel 20.

The organic light-emitting diode display panel 20 includes a substrate 200, a thin film transistor array layer, an organic light-emitting diode array layer, and an encapsulation layer 203.

The thin film transistor array layer includes a plurality of thin film transistors arranged in an array. The thin film transistor array layer includes an active layer 2011, a gate insulation layer 2012, gates 2013, a first insulation layer 2014, patterned metal members 2015, a second insulation layer 2016, source and drain electrodes (20171, 20172), a planarization layer 2018, a pixel definition layer 2019, and support pillars 2020.

The active layer 2011 is disposed on the substrate 200. A preparation material of the active layer 2011 is polysilicon. The gate insulation layer 2012 covers the active layer 2011 and the substrate 200. A preparation material of the gate insulation layer 2012 is selected from at least one of silicon nitride or silicon oxide, and a thickness of the gate insulation layer 2012 ranges from 800 angstroms to 1200 angstroms. The gates 2013 are disposed on the gate insulation layer 2012 and are arranged corresponding to the active layer 2011, a preparation material of the gates 2013 is selected from at least one of molybdenum, aluminum, titanium, or copper. The first insulation layer 2014 covers the gates 2013 and the gate insulation layer 2012, and a preparation material of the first insulation layer 2014 is selected from at least one of silicon nitride or silicon oxide. Each of the patterned metal members 2015 is disposed on the first insulation layer 2014 and corresponding to one of the gates 2013, wherein the patterned metal member 2015 and the gate 2013 form a capacitor. An orthographic projection of one of the patterned metal members 2015 on the touch display device 40 at least completely coincides with an orthographic projection of one of the gates 2013 on the touch display device 40, and a preparation material of the patterned metal members 2015 is same as that of the gates 2013. The second insulation layer 2016 covers the patterned metal members 2015 and the first insulation layer 2014. The source and drain electrodes (20171, 20172) include a source electrode 20171 and a drain electrode 20172. The source electrode 20171 and the drain electrode 20172 are disposed on the second insulation layer 2016. The source electrode 20171 and the drain electrode 20172 pass through the first insulation layer 2014, the second insulation layer 2016, and vias of the gate insulation layer 2012, and are in contact with the active layer 2011, and the source electrode 20171 and the drain electrode 20172 are respectively symmetrically disposed on opposite sides of the gate 2013. The planarization layer 2018 covers the source and drain electrodes (20171, 20172) and the second insulation layer 2016, the planarization layer 2018 is an organic insulation layer, and a thickness of the planarization layer 2018 ranges from 0.8 micron (μm) to 2.5 μm. A plurality of independent anodes are formed on the planarization layer 2018. The pixel definition layer 2019 covers the independent anodes 2021 and the planarization layer 2018. The pixel definition layer 2019 is provided with a plurality of openings corresponding to the independent anodes 2021, and a longitudinal section of the openings is an inverted trapezoid. The pixel definition layer 2019 is an organic insulation layer, and a thickness of the pixel definition layer 2019 ranges from 0.8 μm to 2.5 μm, for example, 2 μm.

The support pillar 2020 is disposed on the pixel definition layer 2019 and is positioned between two adjacent openings of the pixel definition layer 2019. The support pillars 2020 are configured to support the fine mask during a process of evaporating the organic light-emitting layer into the openings. The support pillars 2020 and the pixel definition layer 2019 can be prepared by a single process, for example, by using a same halftone mask combined with a photolithography process. A longitudinal section of the support pillars 2020 is trapezoidal, and a cross section of the support pillar 2020 is circular. A height of the support pillars 2020 ranges from 0.8 microns to 1.2 microns, for example, 1 micron.

The organic light-emitting diode array layer 202 includes organic light-emitting diodes arranged in an array. The organic light-emitting diode array layer includes a plurality of independent anodes 2021, an organic light-emitting layer 2022 disposed on each anode 2021 and positioned in the opening, and a cathode 2023. The organic light-emitting diodes are commonly connected to the cathode, and the cathode 2023 is formed by an entire surface evaporation. A part of the cathode 2023 is formed on the support pillar 2020, another part of the cathode 2023 is formed on the organic light-emitting layer 2022, and another part of the cathode 2023 is formed on the pixel definition layer 2019.

The encapsulation layer 203 is disposed between the cathode 2023 and the touch layer 30. The encapsulation layer 203 is an thin film encapsulation layer. A thickness of the encapsulation layer 203 ranges from 6 μm to 14 μm, for example, 10 μm. The encapsulation layer 203 is configured to prevent the cathode 2023 and the organic light-emitting layer 2022 from being corroded by oxygen or water vapor.

Figure 3:
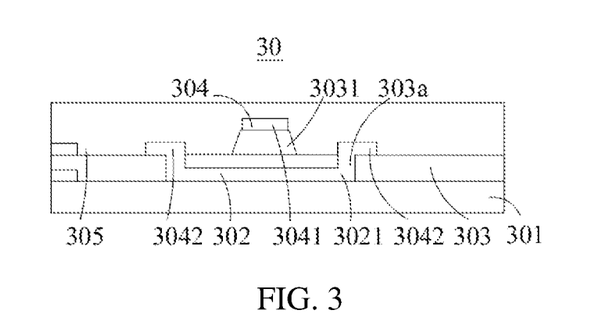
FIG. 3 is a schematic cross-sectional view of a touch layer of the touch display device shown in FIG. 2.

As shown in FIG. 3, it is a schematic cross-sectional view of the touch layer of the touch display device shown in FIG. 2. The touch layer includes a buffer layer 301, a second conductive layer 302, a first passivation layer 303, a first conductive layer 304, and a second passivation layer 305.

The buffer layer 301 is disposed on the encapsulation layer 203. A preparation material of the buffer layer 301 is selected from at least one of silicon nitride or silicon oxide.

The second conductive layer 302 is disposed on the buffer layer 301. The second conductive layer 302 includes bridge lines 3021, and the bridge lines 3021 are composed of metal wires. The bridge lines 3021 are distributed according to a certain rule. Orthographic projections of the bridge lines 3021 on the touch display device are staggered from the orthographic projections of the support pillars 2020 on the touch display device to prevent a formation of parasitic capacitances formed between the bridge lines 3021 and the cathode 2023 positioned on the support pillars 2020, thereby improving a touch reporting rate and a touch sensitivity, etc.

The first passivation layer 303 is an insulation layer. The first passivation layer 303 is positioned between the first conductive layer 304 and the second conductive layer 302. The first passivation layer 303 includes at least one of an organic insulation layer or an inorganic insulation layer. Specifically, the first passivation layer 303 includes an organic insulation layer, and a thickness of the organic insulation layer ranges from 0.8 μm to 1.2 μm, for example, 1 μm.

The protrusions 3031 are provided on the first passivation layer 303, a part of the first conductive layer 304 is formed on a side of the protrusions 3031 away from the cathode 2023, and another part of the first conductive layer 304 is formed on the first passivation layer 303. The protrusions 3031 and the first passivation layer 303 can be fabricated through a same process. The orthographic projections of the protrusions 3031 on the touch display device at least partially coincide with the orthographic projections of the support pillars 2020 on the touch display device to increase a gap between the cathode 2023 positioned on the support pillars 2020 and the first conductive layer 304 formed on the side of the protrusions 3031 away from the cathode 2023, thereby reducing parasitic capacitances formed between the first conductive layer 304 on the protrusions and the cathode 2023 formed on the support pillars, increasing a touch reporting rate.

It should be noted that the orthographic projections of the protrusions 3031 on the touch display device and the orthographic projections of the support pillars 2020 on the touch display device at least partially coincide, wherein the "at least partially coincide" means at least a part of "the orthographic projections of the protrusions 3031 on the touch display device" and at least a part of "the orthographic projections of the support pillars 2020 on the touch display device" are at a same position, and have a same shape and size on a same two-dimensional plane. Hereinafter, the orthographic projections "completely coincide" and the orthographic projections "completely overlap" mean that positions, shapes, and sizes of the projection are exactly same.

In the present embodiment, a gap between the cathode 2023 formed on the pixel definition layer 2019 and a corresponding first conductive layer 304 (the first conductive layer 304 positioned on the first passivation layer 303) is equal to a gap between the cathode 2023 formed on the support pillar 2020 and the first conductive layer 304 provided on the protrusion 3031. By making the gap between the cathode at a position where the support pillar 2020 is not provided in the pixel definition layer 2019 and the corresponding first conductive layer 304 equal to the gap between the cathode on the support pillar 2020 and the first conductive layer 304 on the protrusion 3031, to make the gap between the first conductive layer 304 and the cathode 2023 at different positions the same, preventing an occurrence of touch noise caused by different parasitic capacitances, and improving a touch performance.

Specifically, a height of the protrusion 3031 is equal to the height of the support pillar 2020, so that the gap between the cathode 2023 and the first conductive layer 304 where the support pillar 2020 is not provided in the pixel definition layer 2019 is equal to the gap between the cathode 2023 positioned on the support pillar 2020 and the first conductive layer 304 positioned on the protrusion 3031.

The orthographic projections of the support pillars 2020 on the touch display device is within the orthographic projections of the protrusions 3031 on the touch display device, or the orthographic projections of the support pillars 2020 on the touch display device completely coincide with the orthographic projections of the protrusions 3031 on the touch display device, so that a distance from the first conductive layer 304 provided on a corresponding support pillar 2020 to the cathode 2023 on the support pillar 2020 is increased.

In the present embodiment, the first conductive layer 304 includes first electrodes 3041 and a second electrode 3042. The first electrodes 3041 are electrically insulated from the second electrodes 3042. Two adjacent first electrodes 3041 are formed continuously, two adjacent second electrodes 3042 are electrically connected through the bridge line 302, and each second electrode 3042 and the bridge line 302 are electrically connected through a first via 303a defined on the first passivation layer 303.

The second passivation layer 305 covers the first conductive layer 304 and the first passivation layer 303. The second passivation layer 305 is an insulation layer.

In the present embodiment, the first electrode 3041, the second electrode 3042, and the bridge line 3021 are all composed of metal grids. The metal grids are composed of metal wires. The first electrodes 3041, the second electrodes 3042, and the bridge lines 3021 are correspondingly arranged in the display region of the organic light-emitting diode display panel.

Figure 4:
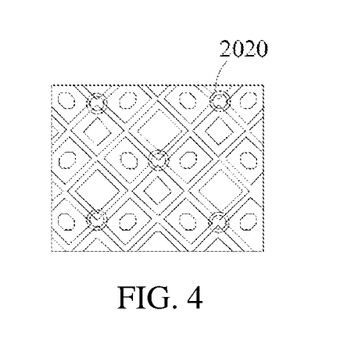
FIG. 4 is a schematic diagram of an arrangement of a metal grid surrounding sub-pixels and a distribution of support pillars according to the present application.

As shown in FIG. 4, it is a schematic diagram of an arrangement of the metal grids surrounding sub-pixels and a distribution of support pillars according to the present application. The organic light-emitting diode display panel includes a plurality of sub-pixels, the touch layer includes a plurality of metal grids, and each metal grid is arranged around one sub-pixel to prevent the metal wires from blocking light emitted by the sub-pixels. The support pillars 2020 are disposed between two adjacent sub-pixels, and there are two sub-pixels, four sub-pixels, or eight sub-pixels arranged between the two adjacent support pillars 2020. The metal grids include rectangular metal grids and diamond-shaped metal grids. The sub-pixels include diamond-shaped sub-pixels.

Figure 5A:
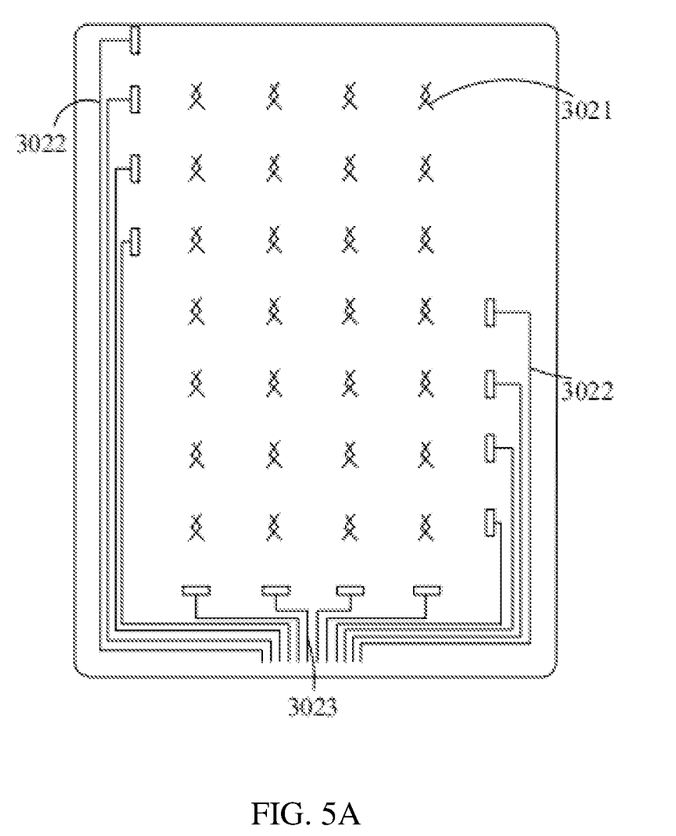
FIGS. 5A-5C are schematic flowcharts showing a process of forming the touch layer according to the present application.
Figure 5B:
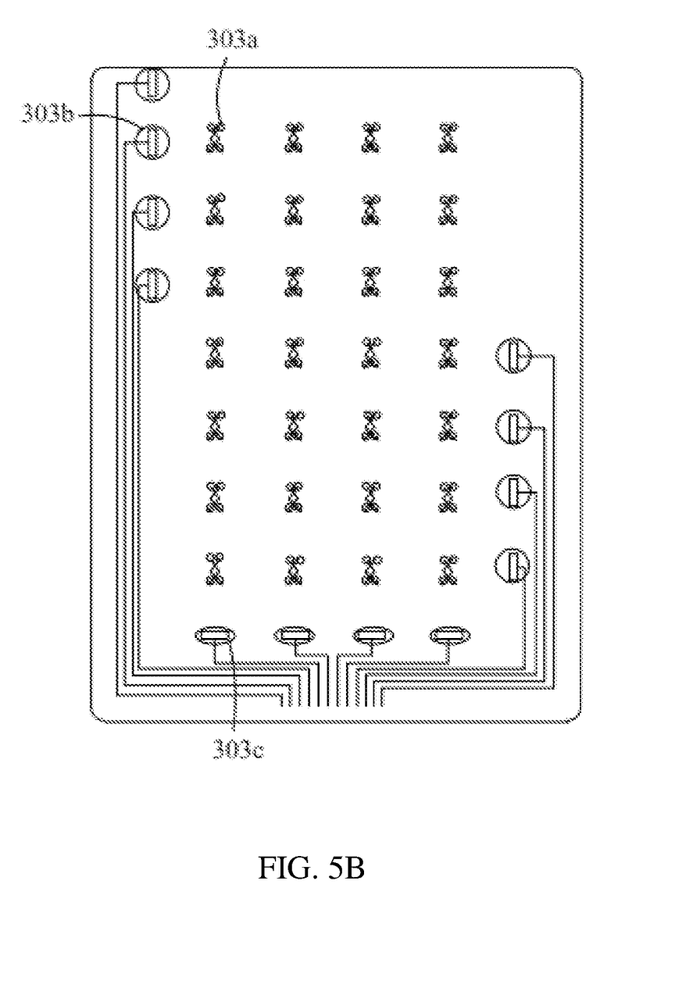
Figure 5C:
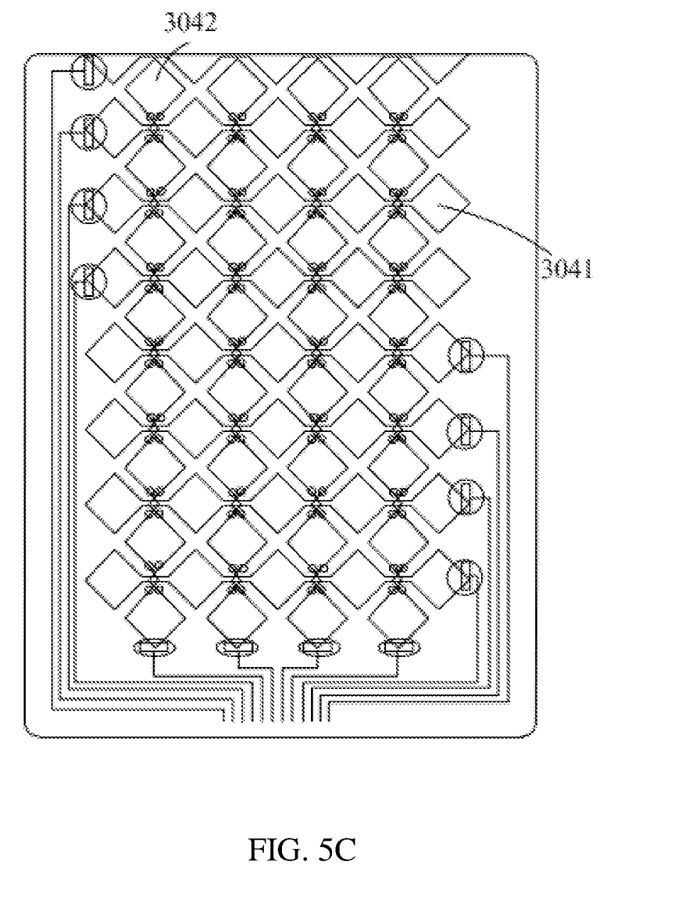

As shown in FIGS. 5A-5C, which are schematic flowcharts showing a process of forming the touch layer of the present application. Steps of forming the touch layer include following.

S100, first, forming a second conductive layer on the entire surface by physical vapor deposition, such as Ti/Al/Ti, or Mo/Cu/Ag, or other metals, and their alloys, and patterning the second conductive layer by a photolithography (dry etching) process to form the bridge lines 3021, third leads 3022, and fourth leads 3023, as shown in 5A.

S101, secondly, forming the first passivation layer 303 covering the bridge lines 3021, the third leads 3022, and the fourth leads 3023, wherein the first passivation layer is patterned by a photolithography (dry etching) process, a first via 303a is formed at an end of each of the bridge lines 3021, and a second via 303b and a third via 303c are correspondingly formed at ends of each touch electrode channel. Wherein the second vias 303b are provided corresponding to the third leads 3022, the third vias 303c are provided corresponding to the fourth leads 3023, as shown in FIG. 5B. A part of the vias defined in the first passivation layer 303 are arranged directly above the third leads 3022.

S102, forming a first conductive layer on an entire surface of the first passivation layer by physical vapor deposition, wherein the first conductive layer is made of Ti/Al/Ti, or other metals such as Mo/Cu/Ag, and their alloys. The first conductive layer is patterned by a photolithography (dry etching) process to form first electrodes 3041 (sensing electrode, RX) that are continuously conductive in a lateral direction, and second electrodes 3042 (driving electrode, TX) that are isolated in a longitudinal direction. Wherein, the isolated second electrodes 3042 are electrically connected to lower bridge lines 3021 through the first vias 303a, thereby forming the second electrodes 3042 that are continuously conductive in the longitudinal direction, as shown in FIG. 5C. In this step, the third leads 3022 are electrically connected to a part of the first electrodes 3041 through the second vias 303b defined in the first passivation layer 303. The fourth leads 3023 are electrically connected to a part of the second electrodes 3042 through the third vias 303c defined in the first passivation layer 303. Moreover, first leads connected to the first electrodes 3041 and second leads connected to the second electrodes 3042 are formed simultaneously. Orthographic projections of the first leads on the touch layer completely coincide with orthographic projections of the third leads 3022 on the touch layer, and the first leads are electrically connected to the third leads in one-to-one correspondence. Orthographic projections of the second leads on the touch layer completely coincide with orthographic projections of the fourth leads 3023 on the touch layer, and the second leads are electrically connected to the fourth leads in one-to-one correspondence, to reduce an impedance of peripheral traces connected to the first electrodes 3041 and the second electrodes 3042. The first leads can be electrically connected to the third leads through the second vias 303b, or can be electrically connected with the first leads through vias defined in the first passivation layer 303 and positioned directly above the third leads 3022.

The present document uses specific embodiments to explain principles and implementation of the application. Descriptions of above embodiments are only used to help understand technical solutions and core ideas of the application. A person skilled in the art can make various modifications and changes to the above embodiments without departing from the technical idea of the present invention, and such variations and modifications are intended to be within the scope of the invention.

What is claimed is:

1. A touch display device, wherein the touch display device comprises:
    an organic light-emitting diode display panel comprising support pillars and a cathode, wherein a part of the cathode is formed on the support pillars;
    a touch layer positioned on a side of the organic light-emitting diode display panel, wherein the touch layer comprises an insulation layer and a first conductive layer, the insulation layer is provided with protrusions, a part of the first conductive layer is positioned on a side of the protrusions away from the cathode, and orthographic projections of the protrusions on the touch display device at least partially coincide with orthographic projections of the support pillars on the touch display device;
    wherein the organic light-emitting diode display panel further comprises a pixel definition layer, the support pillars are arranged on the pixel definition layer, another part of the cathode is formed on the pixel definition layer, and another part of the first conductive layer is formed on the insulation layer;
    wherein a gap defined between the another part of the cathode formed on the pixel definition layer and a corresponding part of the first conductive layer is equal to a gap defined between the part of the cathode formed on the support pillars and the part of the first conductive layer formed on the side of the protrusions away from the cathode;
    wherein the touch layer further comprises a second conductive layer, the insulation layer is positioned between the first conductive layer and the second conductive layer, the second conductive layer comprises bridge lines, and orthographic projections of the bridge lines on the touch display device are staggered from the orthographic projections of the support pillars on the touch display device.

2. The touch display device according to claim 1, wherein a height of the protrusions is equal to a height of the support pillars.

3. The touch display device according to claim 1, wherein the first conductive layer comprises first electrodes and second electrodes, the first electrodes are electrically insulated from the second electrodes, adjacent two of the first electrodes are formed continuously, adjacent two of the second electrodes are electrically connected through the bridge lines, and each of the second electrodes is electrically connected to the bridge lines through a first via defined in the insulation layer.

4. The touch display device according to claim 3, wherein the first conductive layer further comprises first leads and second leads, the second conductive layer further comprises third leads and fourth leads, the third leads are electrically connected to the first leads in one-to-one correspondence, the third leads are electrically connected to a part of the first electrodes through second vias defined in the insulation layer, the fourth leads are electrically connected to the second leads in one-to-one correspondence, and the fourth leads are electrically connected to a part of the second electrodes through third vias defined in the insulation layer.

5. The touch display device according to claim 1, wherein the orthographic projections of the support pillars on the touch display device are positioned within the orthographic projections of the protrusions on the touch display device, or, the orthographic projections of the support pillars on the touch display device completely coincide with the orthographic projections of the protrusions on the touch display device.

6. The touch display device according to claim 1, wherein the insulation layer comprises at least one of an inorganic insulation layer or an organic insulation layer.

7. The touch display device according to claim 1, wherein the organic light-emitting diode display panel comprises a plurality of sub-pixels, and each of the support pillars is disposed between two adjacent sub-pixels.

8. The touch display device according to claim 1, wherein the organic light-emitting diode display panel comprises an encapsulation layer, and the encapsulation layer is disposed between the cathode and the touch layer.

9. A touch display device, wherein the touch display device comprises:
    an organic light-emitting diode display panel comprising a pixel definition layer, support pillars and a cathode, wherein a part of the cathode is formed on the support pillars; and
    a touch layer positioned on a side of the organic light-emitting diode display panel, wherein the touch layer comprises an insulation layer and a first conductive layer, the insulation layer is provided with protrusions, a part of the first conductive layer is positioned on a side of the protrusions away from the cathode, and orthographic projections of the protrusions on the touch display device at least partially coincide with orthographic projections of the support pillars on the touch display device;
    wherein the support pillars are arranged on the pixel definition layer, another part of the cathode is formed on the pixel definition layer, and another part of the first conductive layer is formed on the insulation layer; and
    wherein a gap defined between the another part of the cathode formed on the pixel definition layer and a corresponding part of the first conductive layer is equal to a gap defined between the part of the cathode formed on the support pillars and the part of the first conductive layer formed on the side of the protrusions away from the cathode.

10. The touch display device according to claim 9, wherein a height of the protrusions is equal to a height of the support pillars.

11. The touch display device according to claim 9, wherein the orthographic projections of the support pillars on the touch display device are positioned within the orthographic projections of the protrusions on the touch display device, or, the orthographic projections of the support pillars on the touch display device completely coincide with the orthographic projections of the protrusions on the touch display device.

12. The touch display device according to claim 9, wherein the insulation layer comprises at least one of an inorganic insulation layer or an organic insulation layer.

13. The touch display device according to claim 9, wherein the organic light-emitting diode display panel comprises a plurality of sub-pixels, and each of the support pillars is disposed between two adjacent sub-pixels.

14. The touch display device according to claim 9, wherein the organic light-emitting diode display panel comprises an encapsulation layer, and the encapsulation layer is disposed between the cathode and the touch layer.

* * * * *